(12) United States Patent
Huang et al.

(10) Patent No.: US 6,989,296 B2
(45) Date of Patent: Jan. 24, 2006

(54) FABRICATION METHOD OF SEMICONDUCTOR PACKAGE WITH PHOTOSENSITIVE CHIP

(75) Inventors: Chien-Ping Huang, Taichung (TW); Cheng-Hsu Hsiao, Taichung (TW); Chih-Ming Huang, Taichung (TW)

(73) Assignee: Siliconware Precision Industries Co., Ltd., (TW)

( * ) Notice: Subject to any disclaimer, the term of this patent is extended or adjusted under 35 U.S.C. 154(b) by 0 days.

(21) Appl. No.: 10/844,877

(22) Filed: May 12, 2004

(65) Prior Publication Data
US 2005/0170561 A1   Aug. 4, 2005

(30) Foreign Application Priority Data
Feb. 4, 2004   (TW) .............................. 93102460 A

(51) Int. Cl.
  *H01L 21/44*   (2006.01)
(52) U.S. Cl. ...................... 438/127; 438/113; 438/116; 438/125
(58) Field of Classification Search ............... 438/127, 438/125, 126, 118, 113, 114, 116
See application file for complete search history.

(56) References Cited

U.S. PATENT DOCUMENTS

| | | | | |
|---|---|---|---|---|
| 6,011,304 A | * | 1/2000 | Mertol | 257/706 |
| 6,060,340 A | * | 5/2000 | Chou | 438/110 |
| 6,262,479 B1 | * | 7/2001 | Chou | 257/704 |
| 6,384,472 B1 | * | 5/2002 | Huang | 257/680 |
| 6,590,269 B1 | * | 7/2003 | Chuang et al. | 257/432 |
| 6,784,534 B1 | * | 8/2004 | Glenn et al. | 257/704 |
| 6,900,531 B2 | * | 5/2005 | Foong et al. | 257/687 |

* cited by examiner

*Primary Examiner*—Michael Trinh
(74) *Attorney, Agent, or Firm*—Peter F. Corless; Steven M. Jensen; Edwards & Angell, LLP

(57) ABSTRACT

A fabrication method of a semiconductor package with a photosensitive chip is provided. A substrate having a core is prepared. An interposer is mounted on the substrate, with a peripheral portion of the substrate exposed from the interposer. A molding process is performed and the substrate is clamped between an upper mold and a lower mold, with the interposer received in an upwardly-recessed cavity of the upper mold. A molding compound is injected into the upwardly-recessed cavity to form a dam on the peripheral portion of the substrate. Then the upper and lower molds and the interposer are removed from the substrate to expose area covered by the interposer on the substrate. At least one photosensitive chip is mounted on the exposed area of the substrate. A lid seals the dam such that the chip is received in a space defined by the substrate, the dam and the lid.

22 Claims, 12 Drawing Sheets

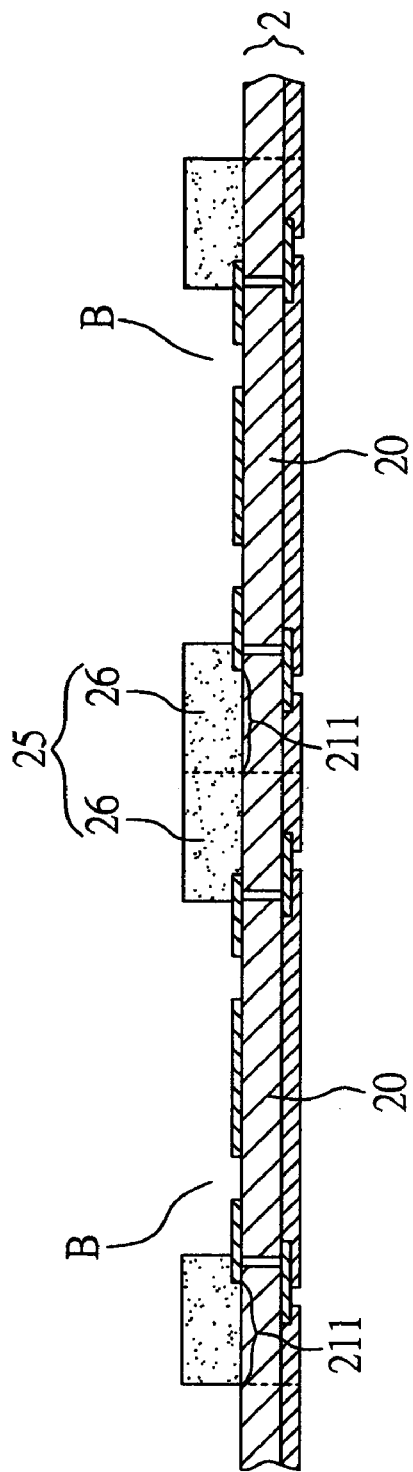
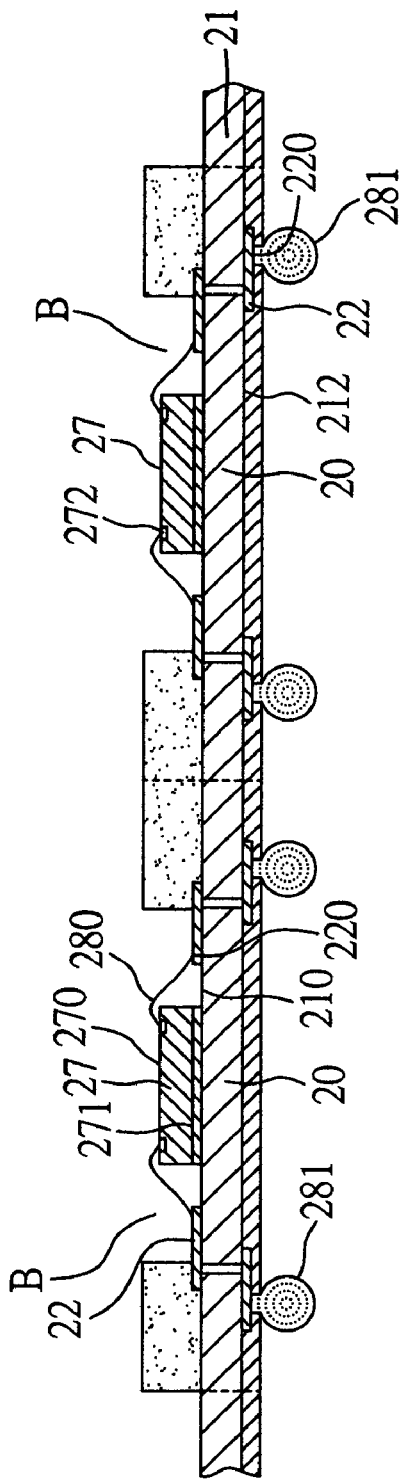
FIG. 1C
FIG. 1D

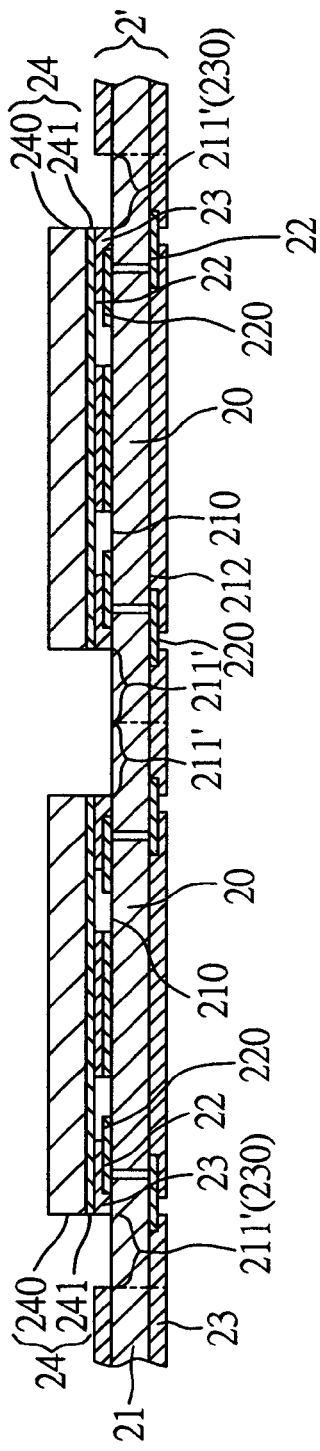
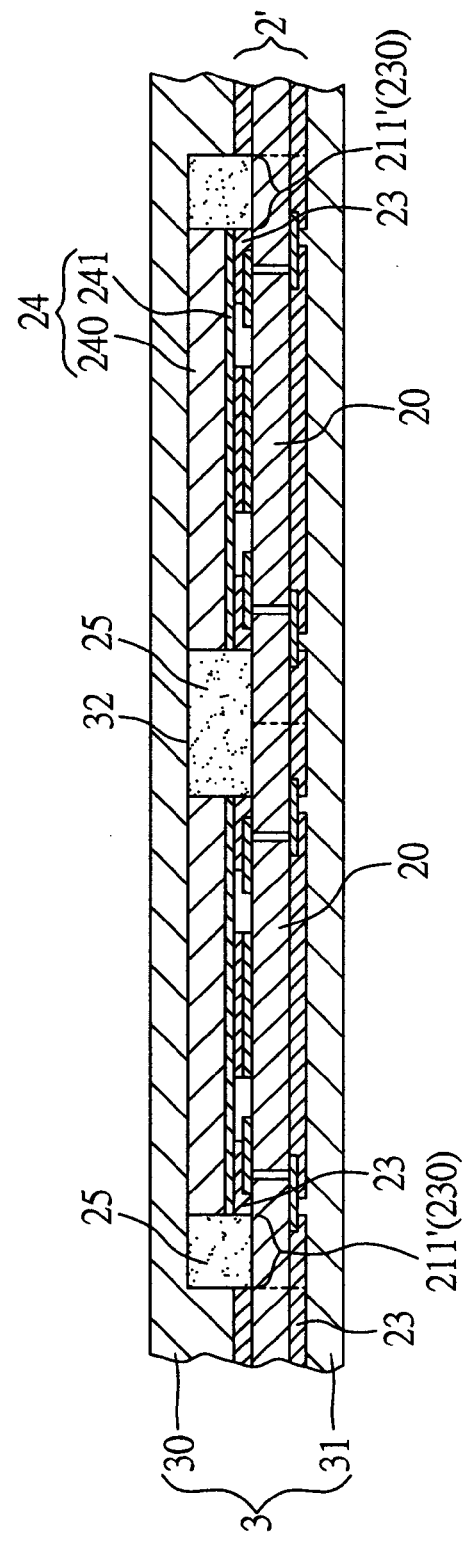
FIG. 3A
FIG. 3B

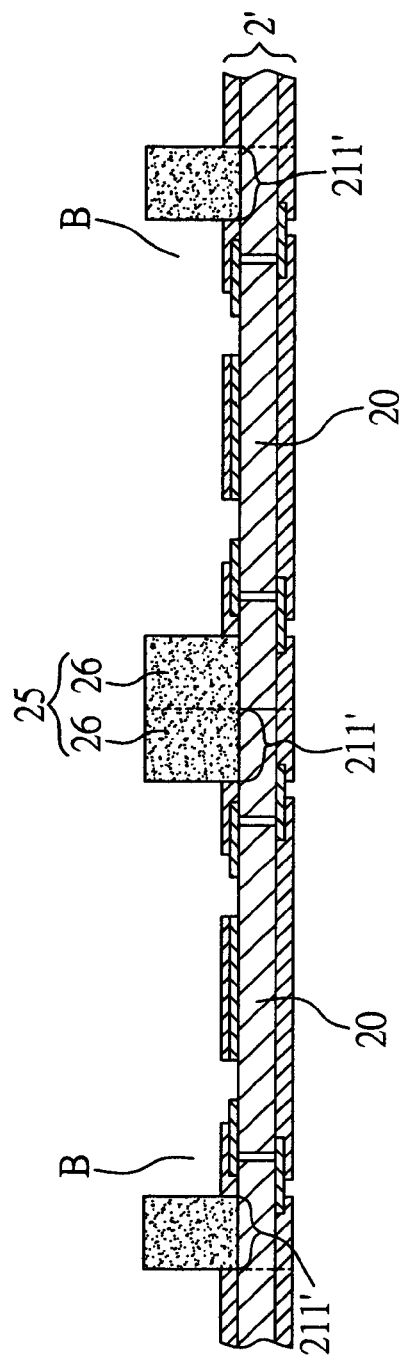
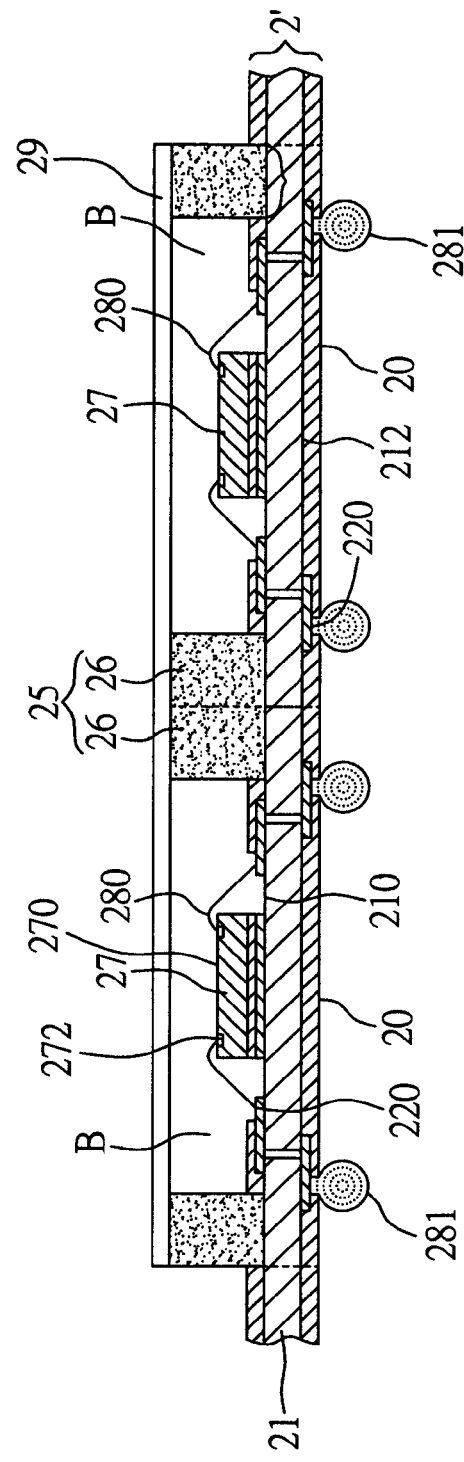

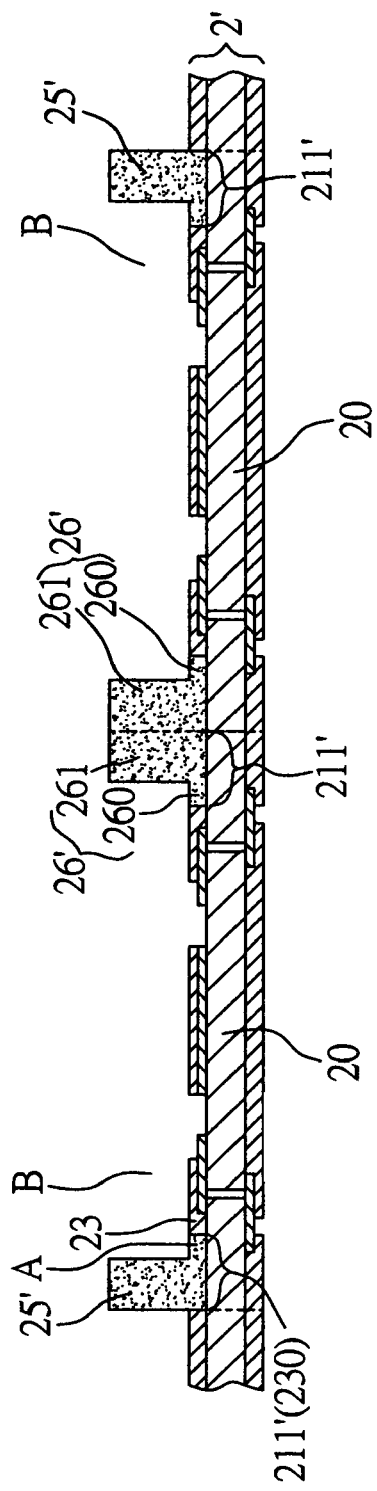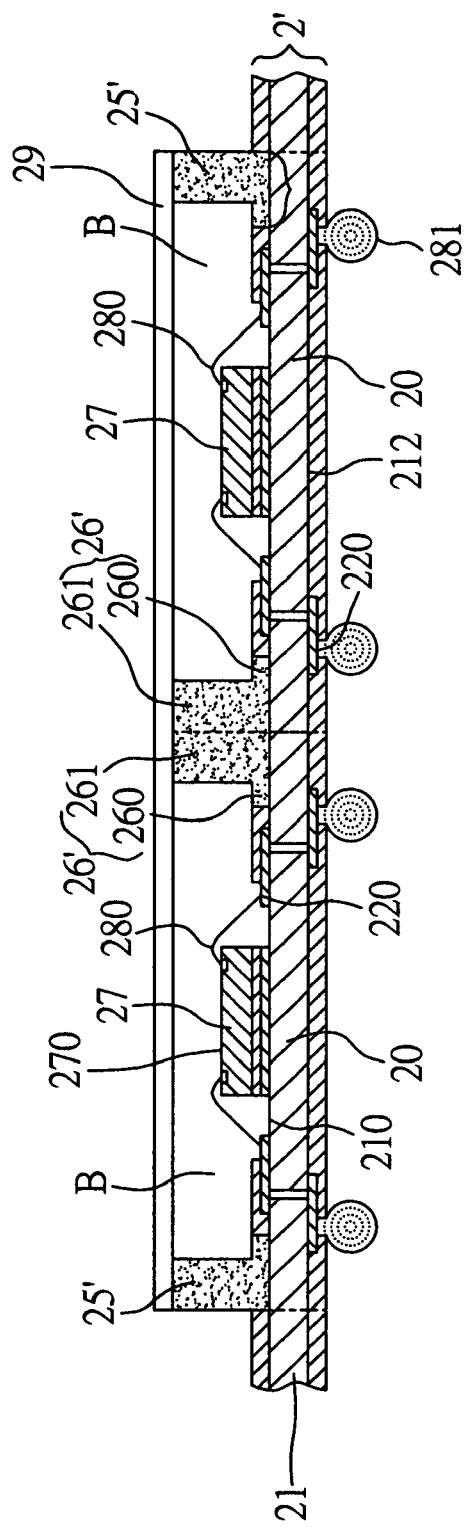

FABRICATION METHOD OF SEMICONDUCTOR PACKAGE WITH PHOTOSENSITIVE CHIP

FIELD OF THE INVENTION

The present invention relates to fabrication methods of semiconductor packages, and more particularly, to a method for fabricating a semiconductor package incorporated with at least one photosensitive chip such as CMOS (complementary metal oxide semiconductor) chip.

BACKGROUND OF THE INVENTION

Semiconductor packages are electronic devices for accommodating active components such as semiconductor chips, whose structure is primarily composed of a chip mounted on a substrate and electrically connected to the substrate via conductive elements such as bonding wires, and an encapsulation body formed by a resin compound (such as epoxy resin, etc.) on the substrate to encapsulate and protect the chip and bonding wires against external moisture and contaminant. The resin compound forming the encapsulation body is usually opaque or non-transparent, thereby making a photosensitive chip such as CMOS (complementary metal oxide semiconductor) chip that requires light for operation not suitably incorporated in such a semiconductor package.

Accordingly, U.S. Pat. No. 6,060,340 provides a semiconductor package with a structurally modified encapsulation body for allowing light to reach the photosensitive chip. As shown in the semiconductor package of FIG. 5, a pre-fabricated encapsulation dam 13 is attached to a substrate 11 via an adhesive 16 and shaped as a wall structure to form a space 14 for receiving the photosensitive chip 10 and a plurality of bonding wires 12 that electrically connect the chip 10 to the substrate 11. A lid 15 is mounted on the encapsulation dam 13 to seal the space 14 and hermetically isolate the chip 10 and bonding wires 12 from the external atmosphere. The lid 15 is made of a light-permeable or transparent material to allow light to go through the lid 15 and reach the chip 10 to facilitate operation of the chip 10. However, the above adhesive has relatively higher moisture absorptivity; when the adhesive with the absorbed moisture is subject to a high temperature in subsequent fabrication processes, it would lead to popcorn effect and delamination between the substrate and the encapsulation dam, thereby damaging the reliability of the semiconductor package.

Another type of semiconductor package suitable for a photosensitive chip is disclosed by U.S. Pat. Nos. 6,262,479 and 6,590,269, whose fabrication steps are shown in FIGS. 6A and 6B and which does not require the above adhesive. Referring to FIG. 6A, a molding process is carried out to form the encapsulation dam 13 on the substrate 11. During molding, an encapsulation mold is used comprising an upper mold 17 having an upwardly-recessed cavity 170 with an insert portion 171 formed in the cavity 170, and a lower mold 18; thus this encapsulation mold is customarily named "insert mold" hereinafter. The substrate 11 is clamped between the upper and lower molds 17, 18, with the insert portion 171 coming into contact with the substrate 11 so as to cover the predetermined area for chip-attachment and wire-bonding on the substrate 11. A resin compound (such as epoxy resin) is injected to the upwardly-recessed cavity 170 to form the encapsulation dam 13 on the substrate 11. By provision of the insert portion 171, the predetermined area for chip-attachment and wire-bonding on the substrate 11 would not be encapsulated by the encapsulation dam 13 and is exposed after the upper and lower molds 17, 18 are removed from the substrate 11, as shown in FIG. 6B. Then, the photosensitive chip 10 and bonding wires 12 are readily mounted on the exposed area of the substrate 11. And finally with the lid 15 attached to the encapsulation dam 13, the semiconductor package is fabricated.

However, the above semiconductor package may still suffer significant drawbacks. The insert portion of the upper mold covers the area on the substrate not to be encapsulated by the resin compound during molding. However, it is not easy to properly control the clamping force between the insert portion and the substrate. If the insert portion is not sufficiently clamped on the substrate, flash of the resin compound may occur between the insert portion and the substrate and thus contaminates the area on the substrate predetermined for chip-attachment and wire-bonding. If the insert portion is too strongly pressed on the substrate, the substrate may be structurally damaged by the insert portion. Moreover, the insert mold is cost-ineffective to fabricate, which requires formation of the insert portion according to the size of substrate or predetermined area on the substrate to be covered by the insert portion. In other words, if the size of substrate or area on the substrate to be covered changes, a new mold with correspondingly-sized insert portion is required, which would undesirably increase the fabrication cost and complicate fabrication processes for the semiconductor package.

Therefore, the problem to be solved herein is to provide a method for fabricating a semiconductor package with a photosensitive chip, which can overcome the above drawbacks to prevent the occurrence of resin flash over the substrate and reduce the fabrication cost.

SUMMARY OF THE INVENTION

An objective of the present invention is to provide a fabrication method of a semiconductor package with a photosensitive chip, without the use of an insert mold for forming an encapsulation body or dam on a substrate, such that the fabrication cost can be reduced and the fabrication processes can be simplified.

Another objective of the present invention is to provide a fabrication method of a semiconductor package with a photosensitive chip, without the use of an insert mold for forming an encapsulation body or dam on a substrate, such that resin flash can be avoided between the mold and the substrate, and the substrate can be prevented from damage by the mold.

A further objective of the present invention is to provide a fabrication method of a semiconductor package with a photosensitive chip, without the use of a conventional adhesive for attaching an encapsulation dam to a substrate, so as to prevent delamination between the dam and substrate and moisture absorption by the adhesive.

In accordance with the foregoing and other objectives, the present invention proposes a fabrication method of a semiconductor package with a photosensitive chip comprising the steps of: preparing a substrate plate comprising an array of substrates, the substrate plate having a core with a plurality of conductive traces formed on at least one surface of the core, each of the conductive traces having a terminal; preparing an interposer comprising an adhesive member and a plate attached onto the adhesive member, and mounting the interposer on each of the substrates via the adhesive member, with a peripheral portion on each of the substrates exposed from the interposer; performing a molding process using an upper mold and a bottom mold, and clamping the substrate plate between the upper and lower molds, wherein the upper mold has an upwardly-recessed cavity for receiving the interposers mounted on the substrates, such that the interposers are interposed between the upper mold and the substrates, and the plates of the interposers are in contact with an inner wall of the upwardly-recessed cavity; and injecting a resin compound into the upwardly-recessed cavity to fill the cavity and form an encapsulation body on the substrate plate, the encapsulation body comprising a plurality of interconnected dams each on the peripheral portion of each of the substrates; removing the upper and lower molds and the interposers from the substrate plate to expose area covered by the interposer on each of the substrates, such that the dam encompasses a space on the exposed area of the corresponding substrate; mounting at least one photosensitive chip on the exposed area of each of the substrates and in the space encompassed by each of the dams, and electrically connecting the chip to the terminals of the conductive traces; attaching a lid to the encapsulation body to seal all the spaces encompassed by the dams on the substrates; and cutting through the lid, the interconnected dams and the substrate plate to separate apart the substrates.

In another preferred embodiment, the fabrication method of a semiconductor package with a photosensitive chip comprises the steps of: preparing a substrate plate comprising an array of substrates, the substrate plate having a core with a plurality of conductive traces formed on at least one surface of the core, each of the conductive traces having a terminal, and applying a solder mask layer over the surface of the core to cover the conductive traces, with the terminals exposed from the solder mask layer, wherein the solder mask layer is formed with an opening to expose a peripheral portion on the surface of the core for each of the substrates, the adjacent substrates having the exposed peripheral portions thereof interconnected; preparing an interposer comprising an adhesive member and a plate attached onto the adhesive member, and mounting the interposer on the solder mask layer of each of the substrates via the adhesive member, with the peripheral portion on each of the substrates exposed from the interposer; performing a molding process using an upper mold and a bottom mold, and clamping the substrate plate between the upper and lower molds, wherein the upper mold has an upwardly-recessed cavity for receiving the interposers mounted on the substrates, such that the interposers are interposed between the upper mold and the substrates, and the plates of the interposers are in contact with an inner wall of the upwardly-recessed cavity; and injecting a resin compound into the upwardly-recessed cavity to fill the cavity and form an encapsulation body on the substrate plate, the encapsulation body comprising a plurality of interconnected dams each on the peripheral portion of each of the substrates; removing the upper and lower molds and the interposers from the substrate plate to expose area covered by the interposer on each of the substrates, such that the dam encompasses a space on the exposed area of the corresponding substrate; mounting at least one photosensitive chip on the exposed area of each of the substrates and in the space encompassed by each of the dams, and electrically connecting the chip to the exposed terminals of the conductive traces; attaching a lid to the encapsulation body to seal all the spaces encompassed by the dams on the substrates; and cutting through the lid, the interconnected dams and the substrate plate to separate apart the substrates.

In a further preferred embodiment, the interposer on each of the substrates protrudes from edge of the solder mask layer and extends above the exposed peripheral portion of the substrate, such that each of the dams on the substrates comprises a shoulder portion and a protruded support portion. The shoulder portion is formed by the resin compound filling a portion of the opening encompassed by the interposer, the edge of the solder mask layer and the core of the substrate, making the shoulder portion adjacent to and flush with the solder mask layer. The support portion is adjacent to the shoulder portion and surrounds the space encompassed by the dam.

It is a characteristic feature that interposers are used in a molding process for forming the encapsulation body or dams on the substrates. The interposers are attached via their adhesive members to the substrates. The interposers are disposed in the upwardly-recessed cavity of the upper mold and between the upper mold and the substrates, such that the interposers together with the upwardly-recessed cavity define the area or space on the substrates to be filled by the resin compound to form the encapsulation body comprising interconnected dams each located on one of the substrates. As a result, instead of an insert mold used in the prior art, a conventional encapsulation mold comprising the upper mold with the upwardly-recessed cavity and the flat lower mold can be utilized in the present invention, which effectively reduces the fabrication cost and simplifies the fabrication processes, as well as the prior-art problems of resin flash and damage to the substrate by the use of the insert mold can be eliminated. After molding, the interposers can be easily removed from the substrates since the adhesive member of the interposer may be an adhesive having poor adhesion or a UV tape whose adhesive can be reduced by UV light. The interposer is cost-effective to fabricate and can be flexibly dimensioned according to the size of substrate, thereby not undesirably increasing the fabrication cost and process complexity of the semiconductor package. It is another characteristic feature that the dam formed on each of the substrate is directly in contact with the exposed peripheral portion of the core. This arrangement effectively enhances adhesion between the dam and the substrate since the dam and the core are both made of resin materials, such that no adhesive in the prior art is required for attaching the dam to the substrate, and the prior-art problems of delamination between the dam and the substrate and moisture absorption by the adhesive can be eliminated. Moreover, the interposer may protrude from edge of the solder mask layer and extend above the exposed peripheral portion of the substrate, thereby forming a portion of the opening of the solder mask layer that is defined by the interposer, the edge of the solder mask layer and the core of the substrate. This portion of the opening is relatively small in size making the resin compound quickly absorb heat from the mold and increase its viscosity when flowing to the opening and approaching the edge of the solder mask layer, such that the resin compound would not flash out of the opening and over unintended area on the substrate. As a result, the chip and bonding wires would not be mounted on flash-contaminated area of the substrate, and the reliability and electrical connection quality can be assured for the fabricated semiconductor package.

BRIEF DESCRIPTION OF THE DRAWINGS

The present invention can be more fully understood by reading the following detailed description of the preferred embodiments, with reference made to the accompanying drawings, wherein:

FIGS. 1A–1F are schematic diagrams showing a series of procedural steps for a fabrication method of a semiconductor package according to a first preferred embodiment of the invention;

FIGS. 3A–3E are schematic diagrams showing a series of procedural steps for a fabrication method of a semiconductor package according to a second preferred embodiment of the invention;

FIGS. 4A–4E are schematic diagrams showing a series of procedural steps for a fabrication method of a semiconductor package according to a third preferred embodiment of the invention;

DETAILED DESCRIPTION OF THE PREFERRED EMBODIMENTS

The preferred embodiments of a fabrication method of a semiconductor package with a photosensitive chip proposed in the present invention are described with reference to FIGS. 1 to 4.

First Preferred Embodiment

FIGS. 1A to 1F show the procedural steps for the fabrication method according to a first preferred embodiment of the invention.

Figure 1A:
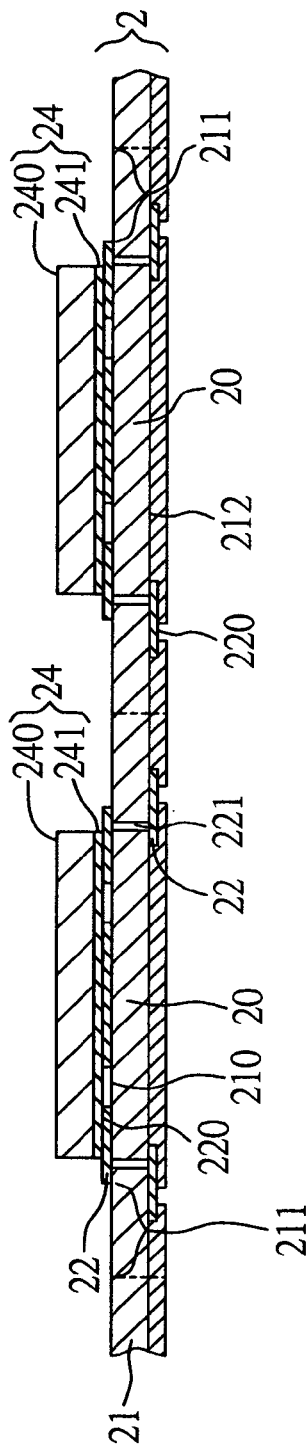

Referring to FIG. 1A, the first step is to prepare a substrate plate 2 comprising an array of substrates 20 that are integrally formed. The substrate plate 2 has a core 21 and a plurality of conductive traces 22 formed respectively on upper and lower surfaces 210, 212 of the core 21. The core 21 is primarily made of a conventional resin material such as epoxy resin, polyimide resin, BT (bismaleimide triazine) resin, FR4 resin, etc. Each of the conductive traces 22 has a terminal 220, wherein the terminals 220 on the upper surface 210 of the core 21 serve as bond fingers and the terminals 220 on the lower surface 212 of the core 21 serve as ball pads in subsequent fabrication processes. The conductive traces 22 on the upper and lower surfaces 210, 212 of the core 21 are electrically interconnected by conductive vias 221. The conductive traces 22 are fabricated by conventional technology such as exposure, development and etching, thereby not further to be detailed here.

Figure 2A:
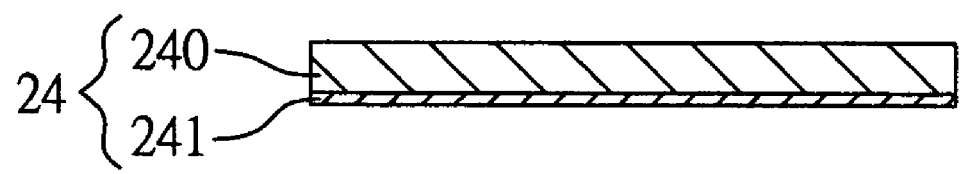
FIGS. 2A and 2B are cross-sectional views showing examples of an interposer according to the invention.
Figure 2B:
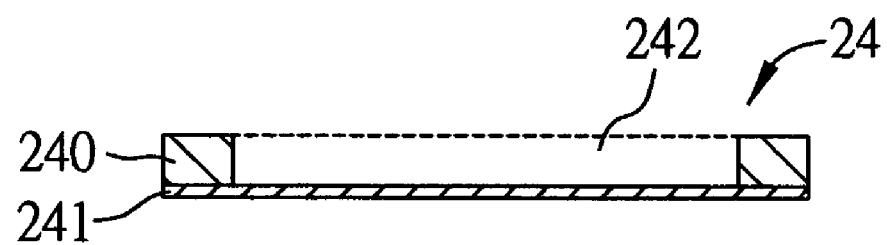

The next step is to prepare an interposer 24 comprising an adhesive member 241 and a plate 240 attached onto the adhesive member 241. The interposer 24 is preferably square-shaped. The plate 240 can be made of a metallic material (such as copper) or a non-metallic material such as thermal resistant substrate material e.g. FR4 resin or urea resin. As shown in FIG. 2A, the adhesive member 241 can be an adhesive having poor adhesion. Alternatively, as shown in FIG. 2B, the adhesive member 241 can be a UV (ultraviolet) tape, and the plate 240 is formed with a hollow portion 242 for allowing UV light to go through the hollow portion 242 and reach the UV tape 241 so as to reduce adhesion of the UV tape 241. The interposer 24 is mounted on each of the substrates 20 via the adhesive member 241 and located on the conductive traces 22 on the upper surface 210 of the core 21. The interposer 24 covers predetermined area for chip-attachment and wire-bonding on each of the substrates 20, with a continuous peripheral portion 211 of the core 21 of each substrate 20 exposed from the interposer 24.

Figure 1B:
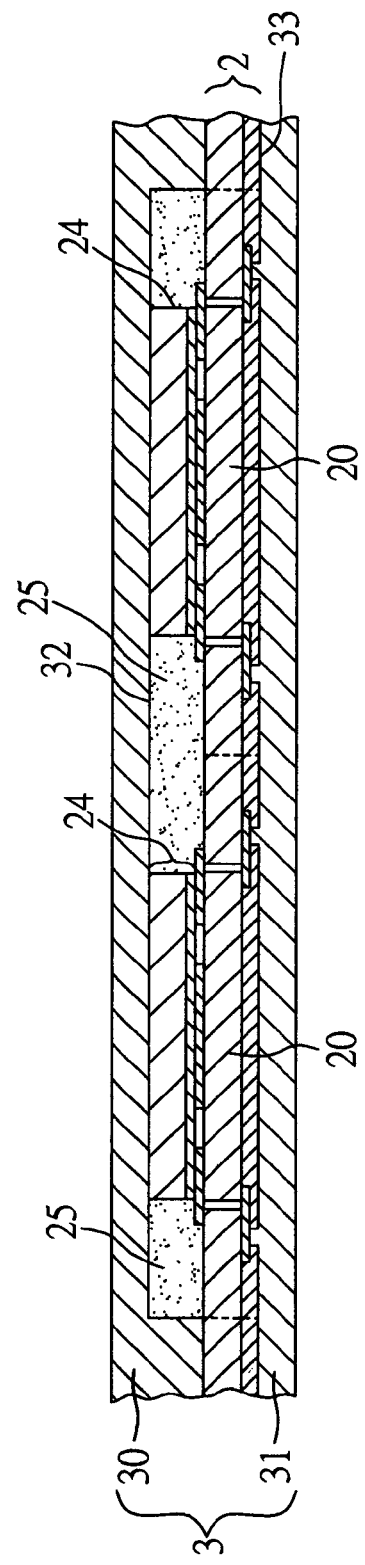

Referring to FIG. 1B, a molding process is performed using an encapsulation mold 3 having an upper mold 30 and a lower mold 31, wherein the upper mold 30 is formed with an upwardly-recessed cavity 32. The above substrate plate 2 is placed in the encapsulation mold 3 and clamped between the upper and lower molds 30, 31. The interposers 24 mounted on the substrates 20 are received in the upwardly-recessed cavity 32 and interposed between the upper mold 30 and the substrates 20. The plates 240 of the interposers 24 are in contact with an inner wall of the upwardly-recessed cavity 32. The bottom mold 31 has a flat top surface 33 in contact with the substrate plate 2. Then, a conventional resin compound (such as epoxy resin, etc.) is injected into and fills the space in the upwardly-recessed cavity 32 of the upper mold 30 not occupied by the interposers 24, so as to form an encapsulation body 25 on the substrate plate 2.

After the resin compound is cured, the encapsulation mold 3 and the interposers 24 are removed from the substrates 20, and the encapsulation body 25 is completely fabricated, as shown in FIG. 1C. The encapsulation body 25 comprises a plurality of interconnected dams 26. Since the predetermined chip-attachment and wire-bonding area on each of the substrates 20 is covered by the interposer 24 and not encapsulated by the resin compound, when the interposer 24 is removed, the chip-attachment and wire-bonding area on the substrate 20 is exposed. As a result, each dam 26 is directly formed on the peripheral portion 211 on each substrate 20 and is shaped as a wall structure encompassing a space B on the exposed area of the substrate 20.

Referring to FIG. 1D, after the encapsulation body 25 is fabricated, at least one photosensitive chip 27 such as CMOS (complementary metal oxide semiconductor) chip is mounted on the exposed area of each of the substrates 20 and in the space B defined by each of the dams 26. The chip 27 has an active surface 270 formed with a plurality of bond pads 272 thereon, and an inactive surface 271 opposed to the active surface 270, allowing the inactive surface 271 of the chip 27 to be attached to the corresponding substrate 20. Then, a wire-bonding process is performed to form a plurality of bonding wires 280 such as gold wires that are bonded to the bond pads 272 on the active surface 270 of the chip 27 and to the terminals or bond fingers 220 on the upper surface 210 of the core 21 of the corresponding substrate 20, making the chip 27 electrically connected to the substrate 20 via the bonding wires 280. A plurality of solder balls 281 are implanted on the terminals or ball pads 220 on the lower surface 212 of the core 21 for each of the substrates 20. The solder balls 281 serve as I/O (input/output) connections to allow the chip 27 to be electrically connected to an external device such as printed circuit board (not shown).

Figure 1E:
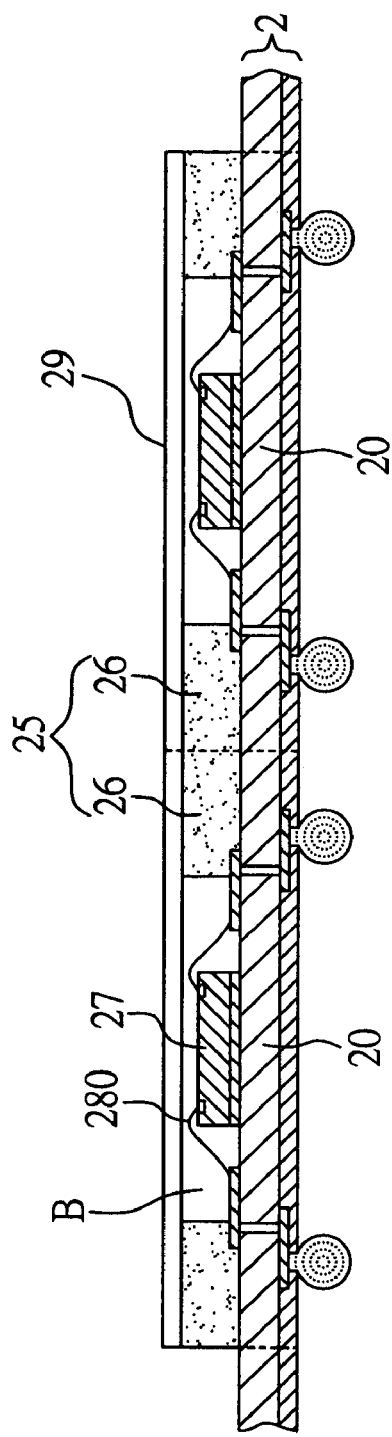

Referring to FIG. 1E, a lid 29 is attached to the encapsulation body 25 to seal the spaces B on the substrates 20, such that the chips 27 and bonding wires 280 are received in the spaces B defined by the substrates 20, the dams 26 and the lid 29. The lid 29 makes the chips 27 and bonding wires 280 hermetically isolated from the external atmosphere. The lid 29 is made of a light-permeable or transparent material to allow light to go through the lid 29 and reach the chips 27 that require light for operation.

Figure 1F:
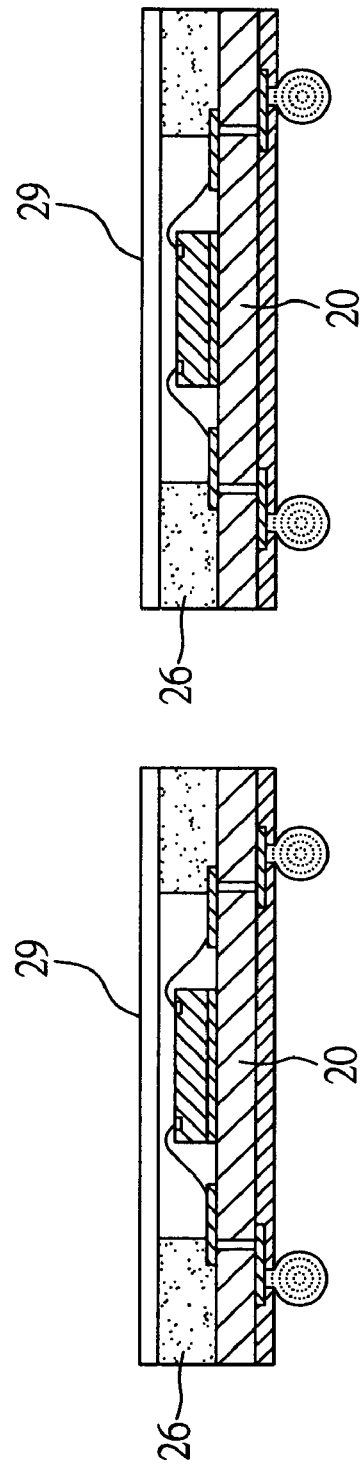

Finally referring to FIG. 1F, a singulation process is performed to cut through the lid 29, the interconnected dams 26 and the substrate plate 2 along the boundary lines (dotted lines shown in FIG. 1E) to separate apart the substrates 20, such that a plurality of individual semiconductor packages according to the present invention are fabricated.

Second Preferred Embodiment

FIGS. 3A to 3E show the procedural steps for the fabrication method according to a second preferred embodiment of the invention.

Referring to FIG. 3A, the first step is to prepare a substrate plate 2' comprising an array of integrally formed substrates 20. This substrate plate 2' is similar in structure to the substrate plate 2 of the above first embodiment (FIG. 1A), but differs in that a solder mask layer 23 (around 25 to 50 µm thick) is applied respectively over the upper and lower surfaces 210, 212 of the core 21 and covers the conductive traces 22, and the terminals 220 of the conductive traces 22 are exposed from the solder mask layers 23. The exposed terminals 220 on the upper surface 210 of the core 21 serve as bond fingers and the exposed terminals 220 on the lower surface 212 of the core 21 serve as ball pads in subsequent fabrication processes. The solder mask layer 23 is formed an opening 230 to expose a continuous peripheral portion 211' on the upper surface 210 of the core 21 for each of the substrates 20, the adjacent substrates 20 having their exposed peripheral portions 211' interconnected.

The next step is to prepare an interposer 24 shown in FIG. 2A or 2B, and mount the interposer 24 on the solder mask layer 23 on the upper surface 210 of the core 21 for each of the substrates 20 via the adhesive member 241 of the interposer 24. The interposer 24 covers predetermined area for chip-attachment and wire-bonding on each of the substrates 20, allowing the peripheral portion 211' of each substrate 20 to be exposed from the interposer 24.

Referring to FIG. 3B, a molding process is performed using the above encapsulation mold 3 having an upper mold 30 and a lower mold 31. The substrate plate 2' is placed in the encapsulation mold 3 and clamped between the upper and lower molds 30, 31, wherein the interposers 24 mounted on the substrates 20 are received in the upwardly-recessed cavity 32 of the upper mold 30 and interposed between the upper mold 30 and the substrates 20. Then, a resin compound (such as epoxy resin, etc.) is injected into the upwardly-recessed cavity 32 to fill the space in the upwardly-recessed cavity 32 not occupied by the interposers 24 and the opening 230 of the solder mask layer 23, so as to form an encapsulation body 25 on the substrate plate 2'.

After the resin compound is cured, the encapsulation mold 3 and the interposers 24 are removed from the substrates 20, and the encapsulation body 25 is completely fabricated, as shown in FIG. 3C. The encapsulation body 25 comprises a plurality of interconnected dams 26, and each dam 26 is directly formed on the peripheral portion 211' on each of the substrates 20 and shaped as a wall structure encompassing a space B on the substrate 20. The predetermined chip-attachment and wire-bonding area on each of the substrates 20 is exposed by removal of the interposer 24.

Referring to FIG. 3D, after the encapsulation body 25 is fabricated, at least one photosensitive chip 27 is mounted on the exposed area of each of the substrates 20 and in the space B defined by the corresponding dam 26. A plurality of bonding wires 280 are bonded to the bond pads 272 on the active surface 270 of the chip 27 and to the exposed terminals or bond fingers 220 on the upper surface 210 of the core 21 of each substrate 20, making the chip 27 electrically connected to the substrate 20 via the bonding wires 280. A plurality of solder balls 281 are implanted on the exposed terminals or ball pads 220 on the lower surface 212 of the core 21 for each of the substrates 20; the solder balls 281 serve as I/O connections. A lid 29 is attached to the encapsulation body 25 to seal the spaces B on the substrates 20, such that the chips 27 and bonding wires 280 are received in the spaces B defined by the substrates 20, the dams 26 and the lid 29. The lid 29 is made of a light-permeable or transparent material.

Figure 3E:
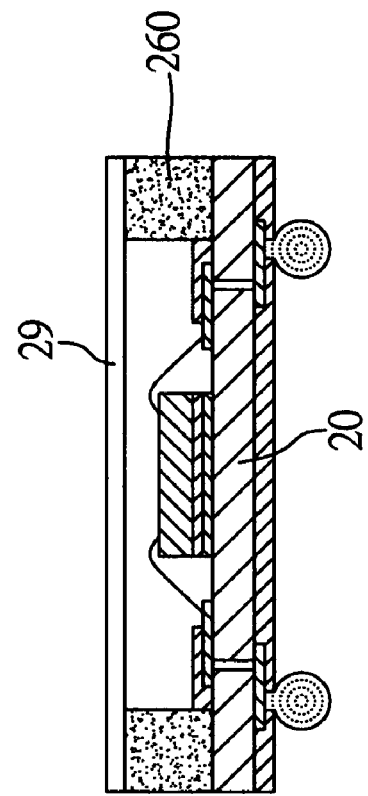
Figure 3E:
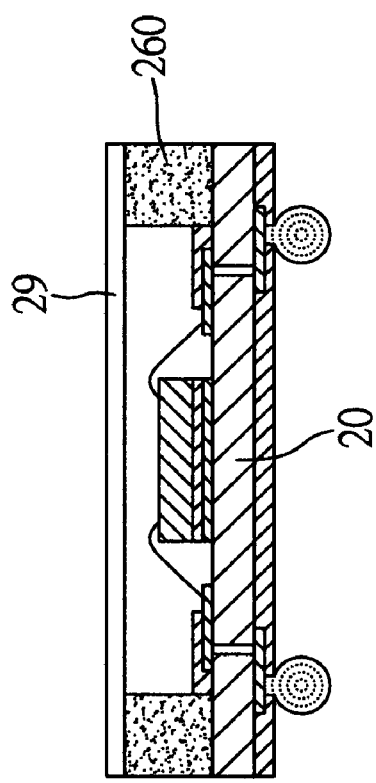

Finally referring to FIG. 3E, a singulation process is performed to cut through the lid 29, the interconnected dams 26 and the substrate plate 2' along the boundary lines (dotted lines shown in FIG. 3D) to separate apart the substrates 20, such that a plurality of individual semiconductor packages according to the present invention are fabricated.

Third Preferred Embodiment

FIGS. 4A to 4E show the procedural steps for the fabrication method according to a third preferred embodiment of the invention.

Figure 4A:
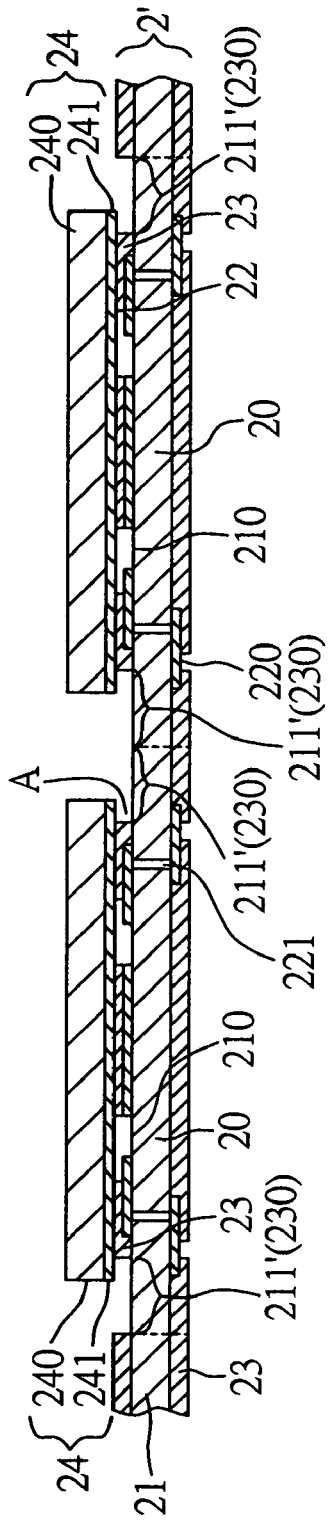

The fabrication method of this third embodiment is similar to that described in the above second embodiment, with the difference in that as shown FIG. 4A, the interposer 24 is mounted on the solder mask layer 23 on the upper surface 210 of the core 21 for each of the substrates 20 of the substrate plate 2' in a manner that, the interposer 24 covers predetermined area for chip-attachment and wire-bonding on each substrate 20, and the interposer 24 protrudes from edge of the solder mask layer 23 and extends above the peripheral portion 211' of the corresponding substrate 20. The interposer 24 protrudes from the edge of the solder mask layer 23 by a distance of from 0.1 to 1 mm, preferably 0.5 mm. As a result, a portion A of the opening 230 on each of the substrates 20 is formed by the interposer 24, the edge of the solder mask layer 23 and the core 21 of the corresponding substrate 20 and is sized correspondingly to the thickness of the solder mask layer 23 of from 25 to 50 µm.

Figure 4B:
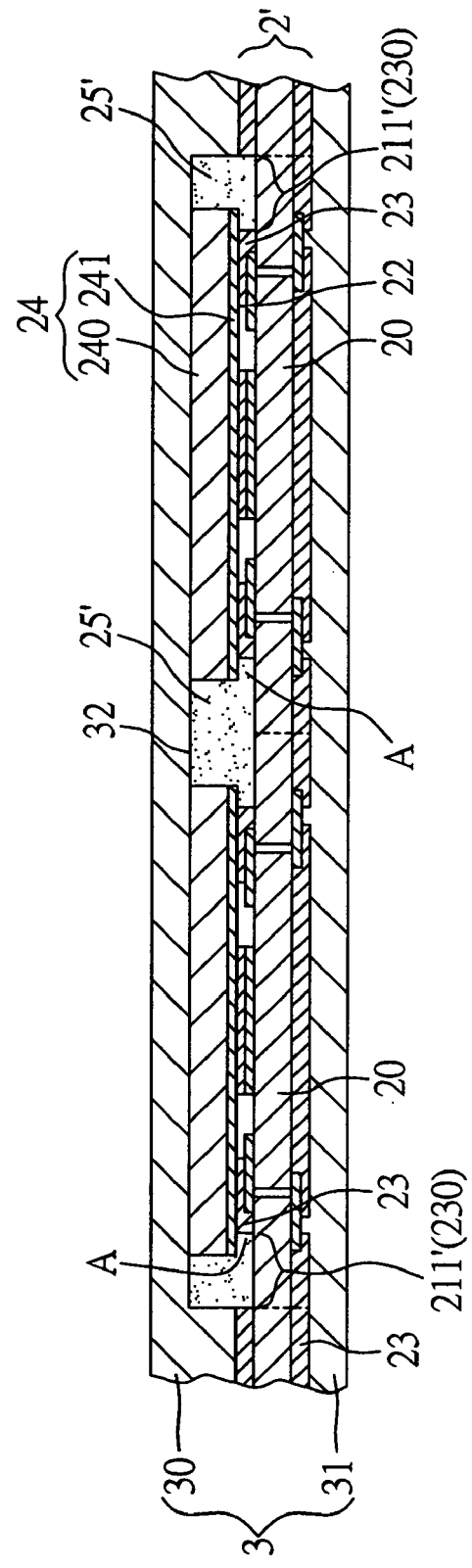

Referring to FIG. 4B, a molding process is performed using the above encapsulation mold 3 having an upper mold 30 and a lower mold 31. The substrate plate 2' is placed in the encapsulation mold 3 and clamped between the upper and lower molds 30, 31, wherein the interposers 24 mounted on the substrates 20 are received in the upwardly-recessed cavity 32 of the upper mold 30 and interposed between the upper mold 30 and the substrates 20. Then, a resin compound (such as epoxy resin, etc.) is injected into the upwardly-recessed cavity 32 to fill the space in the upwardly-recessed cavity 32 not occupied by the interposers 24 and the opening 230 of the solder mask layer 23, so as to form an encapsulation body 25' on the substrate plate 2'. When the resin compound flows to the relatively small portion A of the opening 230 and approaches the edge of the solder mask layer 23, the resin compound would quickly absorb heat from the encapsulation mold 3, such that the viscosity of the resin compound is increased and the flow speed thereof is reduced, making the resin compound confined within the portion A and stop flashing out of the opening 230. The chip-attachment and wire-bonding area on each of the substrates 20 is covered by the interposer 24 and protected against resin flash.

After the resin compound is cured, the encapsulation mold 3 and the interposers 24 are removed from the substrates 20, and the encapsulation body 25' is completely fabricated, as shown in FIG. 4C. The chip-attachment and wire-bonding area on each of the substrates 20 is exposed. The encapsulation body 25' comprises a plurality of interconnected dams 26'. Each dam 26' is directly formed on the peripheral portion 211' of each of the substrates 20 and comprises a shoulder portion 260 and a protruded support portion 261. The adjacent dams 26' have their support portions 261 interconnected. The shoulder portion 260 corresponds to the portion A of the opening 230 filled with the resin compound, making the shoulder portion 260 adjacent to and flush with the solder mask layer 23. The support portion 261 corresponds to the space in the upwardly-recessed cavity 32 of the upper mold 30 not occupied by the interposer 24 and filled with the resin compound, such that the support portion 27 surrounds the shoulder portion 26 and is shaped as a wall structure encompassing a space B on each of the substrates 20.

Referring to FIG. 4D, after the encapsulation body 25' is fabricated, at least one photosensitive chip 27 is mounted on each of the substrates 20 and in the space B defined by the corresponding dam 26'. A plurality of bonding wires 280 are bonded to the active surface 270 of the chip 27 and to the exposed terminals or bond fingers 220 on the upper surface 210 of the core 21 of each substrate 20, such that the chip 27 is electrically connected to the substrate 20 via the bonding wires 280. A plurality of solder balls 281 are implanted on the exposed terminals or ball pads 220 on the lower surface 212 of the core 21 for each of the substrates 20; the solder balls 281 serve as I/O connections. A lid 29 is attached to the support portions 261 of the encapsulation body 25' to seal the spaces B on the substrates 20, such that the chips 27 and bonding wires 280 are received in the spaces B defined by the substrates 20, the dams 26' and the lid 29. The lid 29 is made of a light-permeable or transparent material.

Figure 4E:
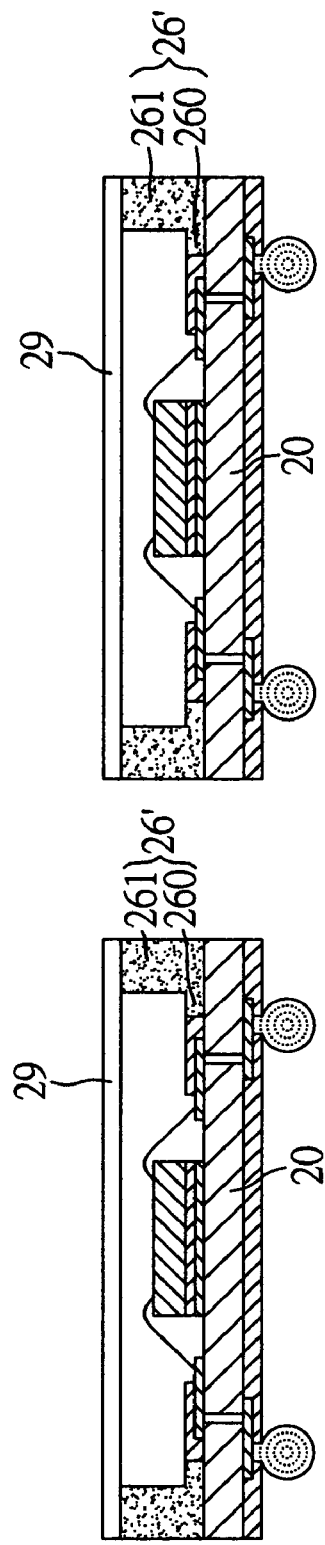
Figure 5:
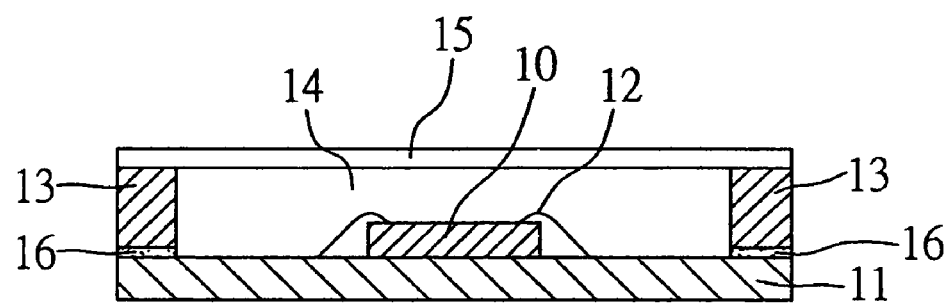
FIG. 5 (PRIOR ART) is a cross-sectional view of a conventional semiconductor package.
Figure 6A:
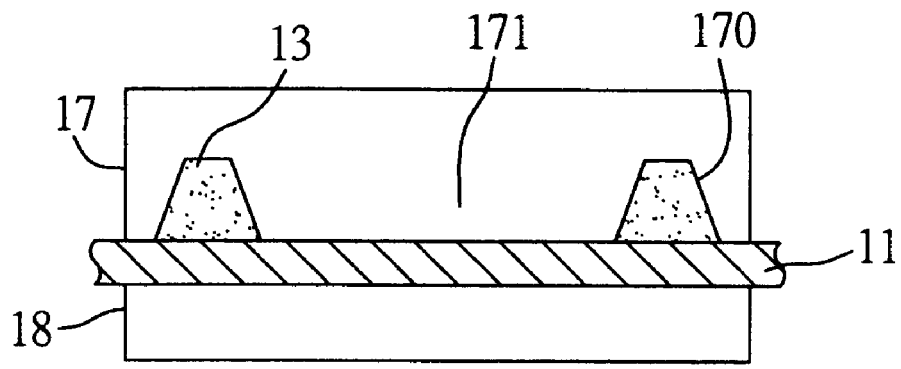
FIGS. 6A and 6B (PRIOR ART) are schematic diagrams showing a series of procedural steps for fabricating another conventional semiconductor package.
Figure 6B:
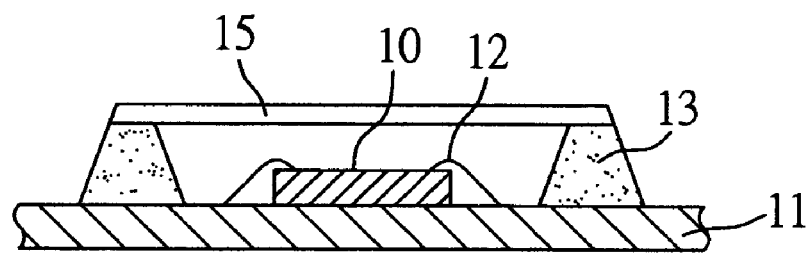

Finally referring to FIG. 4E, a singulation process is performed to cut through the lid 29, the interconnected support portions 261 of the adjacent dams 26' and the substrate plate 2' along the boundary lines (dotted lines shown in FIG. 4D) to separate apart the substrates 20, such that a plurality of individual semiconductor packages according to the present invention are fabricated.

It is a characteristic feature that interposers are used in a molding process for forming the encapsulation body or dams on the substrates. The interposers are attached via their adhesive members to the substrates. The interposers are disposed in the upwardly-recessed cavity of the upper mold and between the upper mold and the substrates, such that the interposers together with the upwardly-recessed cavity define the area or space on the substrates to be filled by the resin compound to form the encapsulation body comprising interconnected dams each located on one of the substrates. As a result, instead of an insert mold used in the prior art, a conventional encapsulation mold comprising the upper mold with the upwardly-recessed cavity and the flat lower mold can be utilized in the present invention, which effectively reduces the fabrication cost and simplifies the fabrication processes, as well as the prior-art problems of resin flash and damage to the substrate by the use of the insert mold can be eliminated. After molding, the interposers can be easily removed from the substrates since the adhesive member of the interposer may be an adhesive having poor adhesion or a UV tape whose adhesive can be reduced by UV light. The interposer is cost-effective to fabricate and can be flexibly dimensioned according to the size of substrate, thereby not undesirably increasing the fabrication cost and process complexity of the semiconductor package. It is another characteristic feature that the dam formed on each of the substrate is directly in contact with the exposed peripheral portion of the core. This arrangement effectively enhances adhesion between the dam and the substrate since the dam and the core are both made of resin materials, such that no adhesive in the prior art is required for attaching the dam to the substrate, and the prior-art problems of delamination between the dam and the substrate and moisture absorption by the adhesive can be eliminated. Moreover, the interposer may protrude from edge of the solder mask layer and extend above the exposed peripheral portion of the substrate, thereby forming a portion of the opening of the solder mask layer that is defined by the interposer, the edge of the solder mask layer and the core of the substrate. This portion of the opening is relatively small in size making the resin compound quickly absorb heat from the mold and increase its viscosity when flowing to the opening and approaching the edge of the solder mask layer, such that the resin compound would not flash out of the opening and over unintended area on the substrate. As a result, the chip and bonding wires would not be mounted on flash-contaminated area of the substrate, and the reliability and electrical connection quality can be assured for the fabricated semiconductor package.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A fabrication method of a semiconductor package with a photosensitive chip comprising the steps of:
   preparing a substrate plate comprising an array of substrates, the substrate plate having a core with a plurality of conductive traces formed on at least one surface of the core, each of the conductive traces having a terminal;
   preparing an interposer comprising an adhesive member and a plate attached onto the adhesive member, and mounting the interposer on each of the substrates via the adhesive member, with a peripheral portion on each of the substrates exposed from the interposer;
   performing a molding process using an upper mold and a bottom mold, and clamping the substrate plate between the upper and lower molds, wherein the upper mold has a cavity for receiving the interposers mounted on the substrates, such that the interposers are interposed between the upper mold and the substrates, and the plates of the interposers are in contact with an inner wall of the cavity; and injecting a resin compound into the cavity to fill the cavity and form an encapsulation body on the substrate plate, the encapsulation body comprising a plurality of interconnected dams each on the peripheral portion of each of the substrates;
   removing the upper and lower molds and the interposers from the substrate plate to expose area covered by the interposer on each of the substrates, such that the dam encompasses a space on the exposed area of the corresponding substrate;
   mounting at least one photosensitive chip on the exposed area of each of the substrates and in the space encompassed by each of the dams, and electrically connecting the chip to the terminals of the conductive traces;
   attaching a lid to the encapsulation body to seal all the spaces encompassed by the dams on the substrates; and
   cutting through the lid, the interconnected dams and the substrate plate to separate apart the substrates.

2. The fabrication method of claim 1, further comprising implanting a plurality of solder balls on a side of each of the substrates opposite to the side mounted with the chip.

3. The fabrication method of claim 1, wherein each of the terminals serves as a bond finger where a bonding wire is bonded to electrically connect the chip to the substrate.

4. The fabrication method of claim 1, wherein the plate of the interposer is made of a metallic material or a non-metallic material.

5. The fabrication method of claim 4, wherein the metallic material is copper.

6. The fabrication method of claim 4, wherein the non-metallic material is a thermal resistant substrate material.

7. The fabrication method of claim 6, wherein the thermal resistant substrate material is FR4 resin or urea resin.

8. The fabrication method of claim 1, wherein the adhesive member of the interposer is a UV (ultraviolet) tape.

9. The fabrication method of claim 1, wherein the plate of the interposer is formed with a hollow portion for allowing UV light to reach the UV tape through the hollow portion so as to reduce adhesion of the tape.

10. The fabrication method of claim 1, wherein the adhesive member of the interposer is an adhesive having poor adhesion.

11. A fabrication method of a semiconductor package with a photosensitive chip comprising the steps of:

preparing a substrate plate comprising an array of substrates, the substrate plate having a core with a plurality of conductive traces formed on at least one surface of the core, each of the conductive traces having a terminal, and applying a solder mask layer over the surface of the core to cover the conductive traces, with the terminals exposed from the solder mask layer, wherein the solder mask layer is formed with an opening to expose a peripheral portion on the surface of the core for each of the substrates, the adjacent substrates having the exposed peripheral portions thereof interconnected;

preparing an interposer comprising an adhesive member and a plate attached onto the adhesive member, and mounting the interposer on the solder mask layer of each of the substrates via the adhesive member, with the peripheral portion on each of the substrates exposed from the interposer;

performing a molding process using an upper mold and a bottom mold, and clamping the substrate plate between the upper and lower molds, wherein the upper mold has a cavity for receiving the interposers mounted on the substrates, such that the interposers are interposed between the upper mold and the substrates, and the plates of the interposers are in contact with an inner wall of the cavity; and injecting a resin compound into the cavity to fill the cavity and form an encapsulation body on the substrate plate, the encapsulation body comprising a plurality of interconnected dams each on the peripheral portion of each of the substrates;

removing the upper and lower molds and the interposers from the substrate plate to expose area covered by the interposer on each of the substrates, such that the dam encompasses a space on the exposed area of the corresponding substrate;

mounting at least one photosensitive chip on the exposed area of each of the substrates and in the space encompassed by each of the dams, and electrically connecting the chip to the exposed terminals of the conductive traces;

attaching a lid to the encapsulation body to seal all the spaces encompassed by the dams on the substrates; and cutting through the lid, the interconnected dams and the substrate plate to separate apart the substrates.

12. The fabrication method of claim 11, further comprising implanting a plurality of solder balls on a side of each of the substrates opposite to the side mounted with the chip.

13. The fabrication method of claim 11, wherein each of the terminals serves as a bond finger where a bonding wire is bonded to electrically connect the chip to the substrate.

14. The fabrication method of claim 11, wherein the interposer on each of the substrates protrudes from edge of the solder mask layer and extends above the exposed peripheral portion of the substrate.

15. The fabrication method of claim 14, wherein each of the dams comprises a shoulder portion and a protruded support portion, the shoulder portion formed by the resin compound filling a portion of the opening defined by the interposer, the edge of the solder mask layer and the core of the substrate, making the shoulder portion adjacent to and flush with the solder mask layer, and the support portion adjacent to the shoulder portion and surrounding the space encompassed by the dam.

16. The fabrication method of claim 11, wherein the plate of the interposer is made of a metallic material or a non-metallic material.

17. The fabrication method of claim 16, wherein the metallic material is copper.

18. The fabrication method of claim 16, wherein the non-metallic material is a thermal resistant substrate material.

19. The fabrication method of claim 18, wherein the thermal resistant substrate material is FR4 resin or urea resin.

20. The fabrication method of claim 11, wherein the adhesive member of the interposer is a UV (ultraviolet) tape.

21. The fabrication method of claim 20, wherein the plate of the interposer is formed with a hollow portion for allowing UV light to reach the UV tape through the hollow portion so as to reduce adhesion of the tape.

22. The fabrication method of claim 11, wherein the adhesive member of the interposer is an adhesive having poor adhesion.

* * * * *